(12) United States Patent
Luo et al.

(10) Patent No.: US 6,993,300 B2
(45) Date of Patent: Jan. 31, 2006

(54) ACCURATE GAIN DIRECT MODULATION (KMOD) USING A DUAL-LOOP PLL

(75) Inventors: Wenzhe Luo, Allentown, PA (US); Zhigang Ma, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 443 days.

(21) Appl. No.: 10/131,213

(22) Filed: Apr. 25, 2002

(65) Prior Publication Data

US 2003/0203724 A1    Oct. 30, 2003

(51) Int. Cl.
*H04B 1/02* (2006.01)
(52) U.S. Cl. .................... 455/108; 455/110; 455/118
(58) Field of Classification Search ............ 455/91, 455/108, 110, 112, 113, 118, 119, 126; 331/10, 331/1 R, 14, 25, 17, 117 R, 16; 375/295, 375/300, 302; 332/127
See application file for complete search history.

(56) References Cited

U.S. PATENT DOCUMENTS

| | | | | |
|---|---|---|---|---|
| 4,810,977 A | * | 3/1989 | Flugstad et al. ............ 455/113 |
| 5,027,087 A | * | 6/1991 | Rottinghaus ................. 331/10 |
| 5,625,325 A | * | 4/1997 | Rotzoll et al. ................ 331/16 |
| 5,831,483 A | * | 11/1998 | Fukuda ....................... 331/17 |
| 6,593,826 B2 | * | 7/2003 | See ........................ 331/117 R |
| 6,650,194 B1 | * | 11/2003 | Kertis et al. ............ 331/117 R |
| 2005/0116782 A1 | * | 6/2005 | Smith ......................... 331/17 |

\* cited by examiner

*Primary Examiner*—Lana Le

(57) ABSTRACT

The present invention provides a baseband RF clock synthesizer having particular use in a BLUETOOTH piconet device, which has the capability of providing simple and accurate calibration of modulation path gain (KMOD) by introducing a dual-loop phase locked loop (PLL) in the RF clock signal synthesizer. The disclosed technique and apparatus controls the maximum frequency deviation by the difference of two locked frequencies, one frequency in each path of the dual-path PLL. Once the PLL is locked within some frequency error, the present technique and apparatus calibrates for the deviation of amplitude of the modulation due to the modulation path. Accordingly, modulation gain (KMOD) calibration is provided by adding an auxiliary loop to a PLL in an RF frequency synthesizer.

19 Claims, 6 Drawing Sheets

CONTROL OF KMOD CALIBRATION WITH DUAL PLL LOOP

CIRCUIT TECHNIQUES TO MINIMIZE THE FREQUENCY DRIFTING

ACCURATE GAIN DIRECT MODULATION (KMOD) USING A DUAL-LOOP PLL

BACKGROUND OF THE INVENTION

1. Field of the Invention

The present invention relates to piconet wireless networks. More particularly, it relates to baseband clock generation for BLUETOOTH™ radio frequency (RF) integrated circuits, and even more particularly to a direct voltage controlled oscillator (VCO) modulation scheme having particular use for the transmission of frequency shift keying (FSK) type data signals.

2. Background of Related Art

Piconets, or small wireless networks, are being formed by more and more devices in many homes and offices. In particular, a popular piconet standard is commonly referred to as a BLUETOOTH piconet. Piconet technology in general, and BLUETOOTH technology in particular, provides peer-to-peer communications over short distances.

The wireless frequency of piconets may be 2.4 GHz as per BLUETOOTH standards, and/or typically have a 20 to 100 foot range. The piconet RF transmitter may operate in common frequencies which do not necessarily require a license from the regulating government authorities, e.g., the Federal Communications Commission (FCC) in the United States. Alternatively, the wireless communication can be accomplished with infrared (IR) transmitters and receivers, but this is less preferable because of the directional and visual problems often associated with IR systems.

A plurality of piconet networks may be interconnected through a scatternet connection, in accordance with BLUETOOTH protocols. BLUETOOTH network technology may be utilized to implement a wireless piconet network connection (including scatternet). The BLUETOOTH standard for wireless piconet networks is well known, and is available from many sources, e.g., from the web site www.bluetooth.com.

According to the BLUETOOTH specification, BLUETOOTH systems typically operate in a range of 2400 to 2483.5 MHz, with multiple RF channels. For instance, in the US, 79 RF channels are defined as f=2402+k MHz, k= 0, . . . , 78. This corresponds to 1 MHz channel spacing, with a lower guard band (e.g., 2 MHz) and an upper guard band (e.g., 3.5 MHz).

To receive a radio frequency (RF) signal from another piconet device, the receiving device must lock onto the transmitted frequency. All devices have a local clock oscillator on which a baseband clock signal in an RF section is based.

While ideally both the transmitting device and the receiving device would include identical local clock oscillator sources, this is not the case in the real world. For instance, clock signals jitter and vary somewhat within desired tolerable limits due to environmental conditions such as the temperature of the device, the exact frequency of the particular crystal oscillator in the device, etc. Design standards typically allow some amount of jitter and gain variation. For instance, the current BLUETOOTH™ piconet network standard specifies that the clock jitter (rms value) should not exceed 2 nS and the settling time should be within 250 uS.

The BLUETOOTH standard also requires that the maximum deviation of a transmitted frequency be in the range 140–175 KHz. However, particularly because of the extremely high frequency of the transmission channels (e.g., 2.4 to 2.5 GHz), it's rather difficult to maintain deviations to within this range. This is particularly true since variations in modulation frequency gain (KMOD) introduced by a modulation path is typically 10 to 15%. Also, the temperature dependence of a varactor used in the clock signal frequency synthesis path is also quite significant (approx. 10%). Process variation from device to device, and even from design to device, can lead to even larger variations in modulation gain.

Thus, it is clear that modulation gain (KMOD) varies in any given transmit path, and control of modulation gain (KMOD) has been a difficult task in the art. Given a large amount of bandwidth for any given number of transmit channels, adequate tolerances can be provided on either sides of each defined channel to prevent interference. However, as bandwidth becomes more scarce and demand continues to increase, there is a need for tighter tolerances and improved methods to meet these tighter tolerances. Accordingly, a more tightly maintained accuracy (referred to herein as "calibration") of frequency modulation gain in a particular transmit path is required to allow increased numbers of channels in any given frequency range.

FIG. 7 shows a conventional RF front end including a reference frequency input to a single loop PLL having direct data injection.

In particular, as shown in FIG. 7, a reference frequency 104 is injected into the input of a single loop PLL 704 and ultimately transmitted by a suitable power amplifier 106. In such a system, direct modulation may be used wherein data 102 is injected into a voltage controlled oscillator at an output of the PLL 704. While such modulation systems are suitable, they nevertheless fall victim to unintended modulation gain in the channel path in the PLL 704.

One conventional "calibration" method of controlling modulated gain (KMOD) includes the use of a look-up table. The look-up table has been used to compensate for channel and temperature variations due to modulated gain (KMOD). However, these look-up tables require the determination of the actual temperature, assuming that the temperature of the transmit channel can be sensed correctly. Moreover, even with look-up table calibration, other factors causing variations in modulation gain (KMOD) (such as process variation effects) remain un-calibrated and un-cancelled.

There is a need for an improved approach to maintain an accurate modulation within allowed tight frequency tolerances in a modulation path of an RF device (particularly a BLUETOOTH piconet device).

SUMMARY OF THE INVENTION

In accordance with the principles of the present invention, a phase locked loop in an RF transmission system comprises a first forward path to lock on a transmission channel frequency of the RF transmission system. A second forward path locks on an error offset associated with modulation gain through the phase locked loop. A common feedback path is used by both the first forward path and the second forward path.

A method of transmitting a data signal accurately in a transmission channel in accordance with another aspect of the present invention comprises activating a first loop of a phase locked loop to lock a first main loop of the phase locked loop to a transmit channel frequency. A second loop of the phase locked loop is activated to lock the phase locked loop to the transmit channel frequency plus a deviation. The first loop of the phase locked loop is reactivated, and data is modulated directly to a voltage controlled oscillator of the phase locked loop, whereby modulation gain is calibrated.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides accurate modulation within extremely tight tolerance limits (e.g., +/−150 KHz on a 2.4 to 2.5 GHz carrier) by using direct modulation of a dual loop voltage controlled oscillator (VCO), which outputs a modulated frequency signal to a power amplifier for transmission.

Direct modulation provides a straight forward method of data transmission, and saves several costly components in a transmit path, e.g., a digital-to-analog converter (DAC) and an up-mixer from a baseband frequency to a reference frequency. Direct modulation is also well suited for integration with other systems.

The present invention provides a baseband clock synthesizer having particular use in a piconet device, e.g., a BLUETOOTH™ piconet device, which has the capability of providing simple and accurate calibration of modulation path gain (KMOD) maintaining the modulation within narrow frequency channels and minimizing or avoiding undesirable frequency gain caused in a modulation path of otherwise conventional RF modulation systems.

Calibration of the modulation gain in the PLL path of the direct modulation is provided by introducing a dual-loop phase locked loop (PLL) in an RF clock signal synthesizer. The disclosed technique and apparatus controls the maximum frequency deviation to the difference of two locked frequencies, one frequency in each path of a dual-path PLL. Accordingly, modulation gain (KMOD) calibration is provided by adding an auxiliary loop to a PLL in an RF frequency synthesizer.

Figure 1:
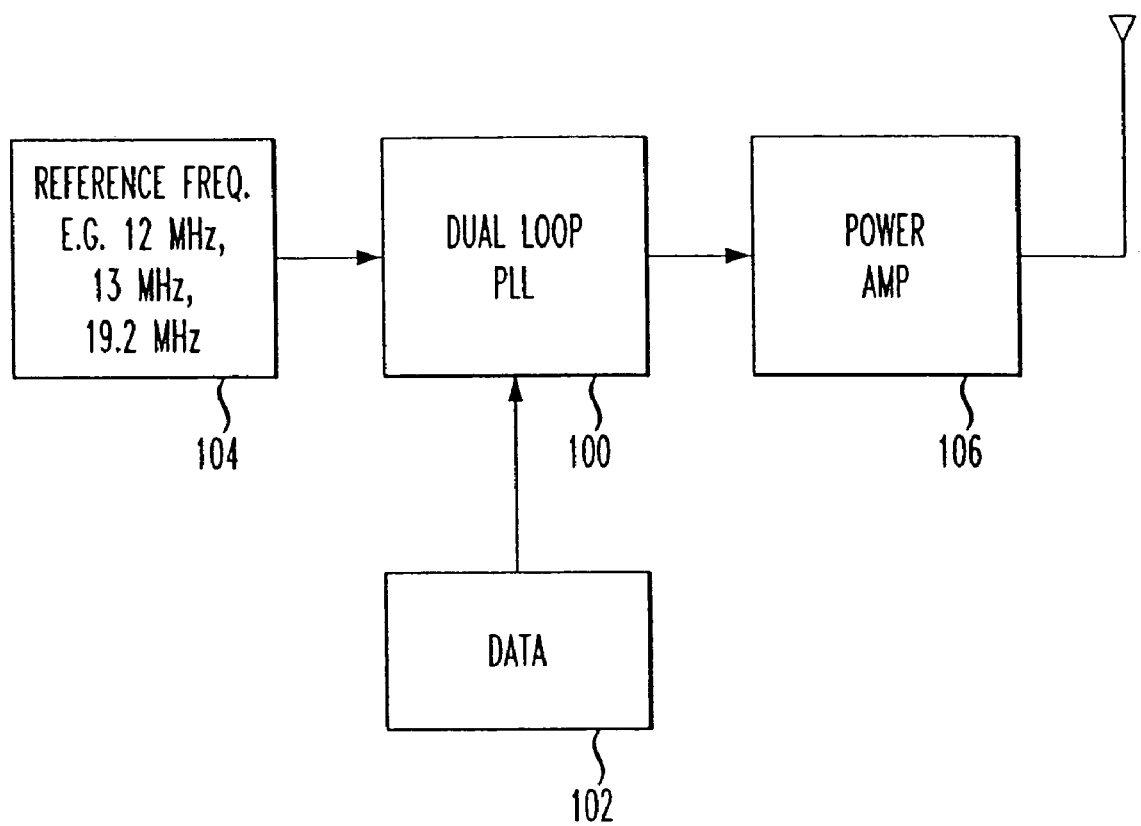
FIG. 1 shows data modulation in an RF front end including a dual-loop phase locked loop (PLL), in accordance with the principles of the present invention.

FIG. 1 shows data modulation in an RF front end including a dual-loop phase locked loop (PLL), in accordance with the principles of the present invention.

In particular, as shown in FIG. 1, one loop of a dual loop PLL 100 is locked to a reference frequency 104, and direct modulation is provided via another loop of the dual loop PLL 100 corresponding to a data stream input 102.

The reference frequency may be, e.g., 12 MHz, 13 MHz, or 19.2 MHz, as in current BLUETOOTH piconet device standards. Of course, other reference frequencies are possible within the principles of the present invention.

The dual loop PLL 100 provides a modulated carrier signal to drive a power amplifier 106 and transmission from the RF front end.

Figure 2:
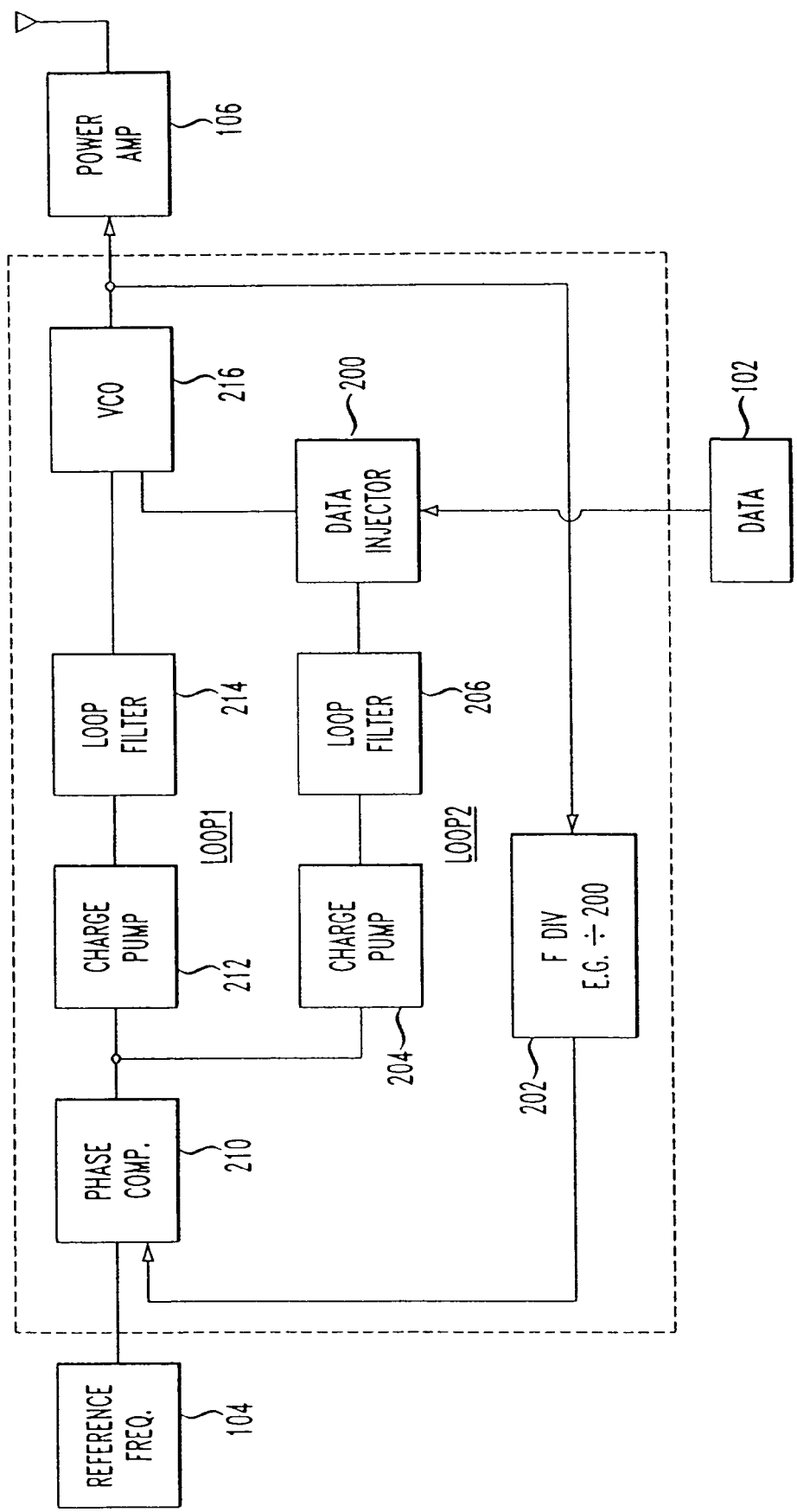
FIG. 2 shows the dual-loop PLL shown in FIG. 1 in more detail, including a data injector that directly modulates a voltage controlled oscillator (VCO), in accordance with the principles of the present invention.

FIG. 2 shows an exemplary embodiment of the dual-loop PLL 100 shown in FIG. 1 in more detail.

In particular, as shown in FIG. 2, the dual loop PLL 100 includes a first input path formed by a series connection of a phase detector/comparator 210, a charge pump 212, a loop filter 214, and a voltage controlled oscillator (VCO) 216, and a feedback path formed by a frequency divider 202 between the output of the VCO 216 and a second input to the phase comparator 210.

The exemplary dual loop PLL 100 is an integer-N PLL, meaning that feedback control is provided by integer division provided by the frequency divider 202.

The phase detector/comparator 210 compares the phase of the input clock signal from the reference frequency 104, to the phase of a feedback path from the frequency divider 202. In the given embodiment, the reference frequency 104 would be set to a desired transmit channel, e.g., to 2.45 GHz in a BLUETOOTH application.

The charge pump 212 is another fundamental component of a digital PLL which outputs a signal corresponding to the difference in the phase determined by the phase comparator 210.

The loop filter 214 (e.g., a large capacitor or integrater) holds the charge output from the charge pump 212 to steadily control the VCO 216.

The frequency divider 202 provides division of the feedback path by an integer value, e.g., 200.

A second forward path is formed by a second charge pump 204, a second loop filter 206, both of which are of similar construction and operation as the first charge pump 212 and first loop filter 214.

The first forward loop LOOP1 of the dual-loop PLL 100 is the main loop of the dual-loop PLL 100. The first loop LOOP1 locks the PLL 100 to the correct transmit channel frequency (e.g., 2.45 GHz). The second forward loop LOOP2 of the dual-loop PLL 100 is an auxiliary loop that provides the ability for what is termed "KMOD calibration".

Importantly, the dual loop PLL 100 includes a data injector 200 that directly modulates the VCO 216 in combination with the direct modulation control provided by the first forward path 210–216. The data injector 200 is driven by the data stream 102, and provides control directly to the VCO 216, utilizing its own, second PLL loop formed by the charge pump 204 and loop filter 206.

Figure 3:
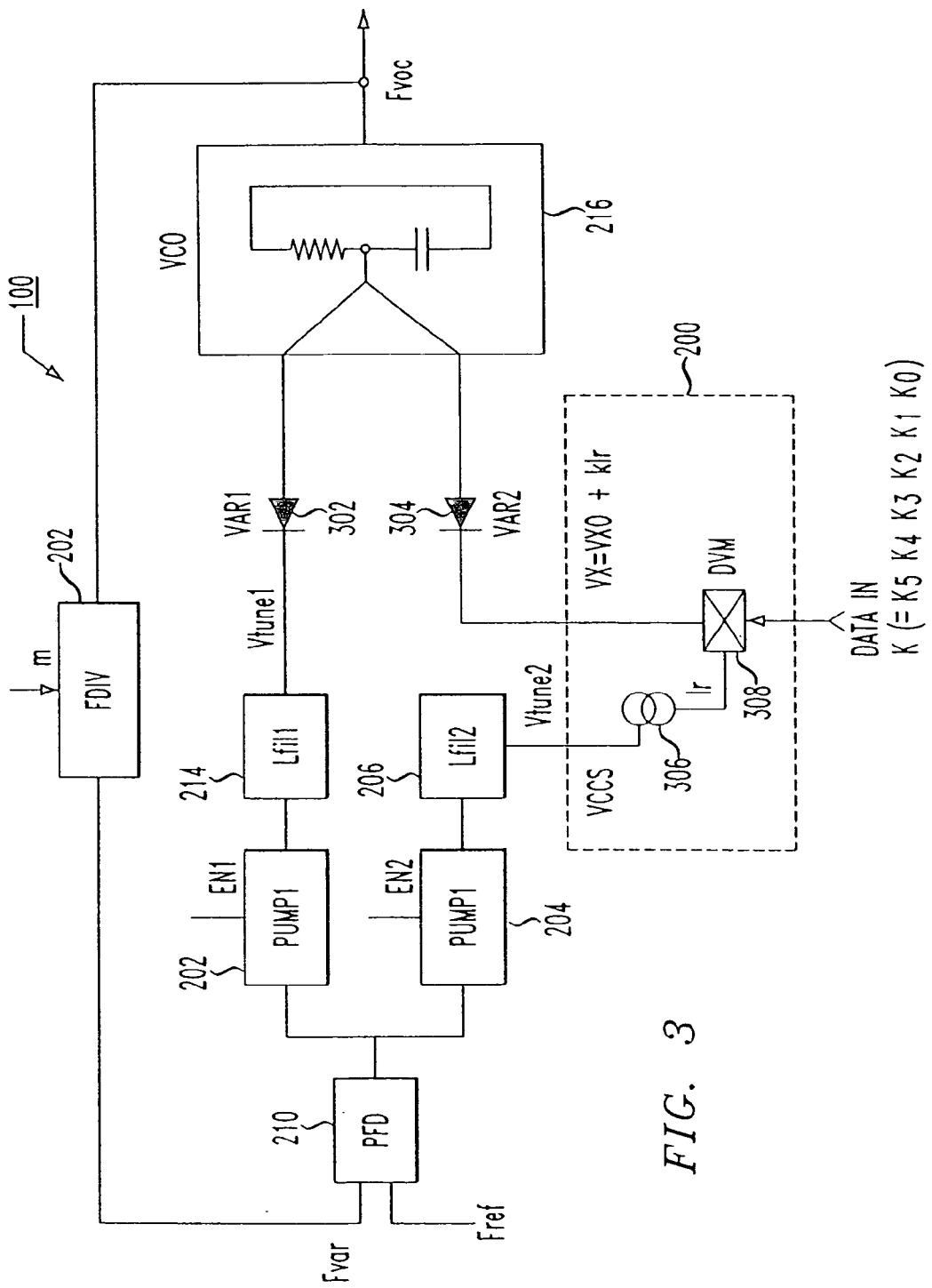
FIG. 3 shows exemplary components of the dual-loop PLL shown in FIGS. 1 and 2, including direct modulation of a VCO, in accordance with the principles of the present invention.

FIG. 3 shows exemplary components of the dual-loop PLL 100 shown in FIGS. 1 and 2, including direct modulation of a VCO 216 both by a first forward path via a first varactor 302, and by a second forward path via a second varactor 304. The architecture shown in FIG. 3 is referred to herein as a KMOD calibration scheme.

In the dual-loop architecture, the phase detector/comparator 210, the VCO 216, and the frequency divider 202 are shared between the two forward loops of the dual-loop PLL 100.

The data injector 200 includes a voltage controlled current source (VCCS) 306, and a deviation multiplier (DVM) 308 between the loop filter (Lfil2) 206 and the varactor (VAR2) 304 of the second loop of the dual-loop PLL 100. The data injector 200 allows transmission data to modulate the VCO 216, independent from the path of the reference frequency through the dual-loop PLL 100.

The charge pumps 212, 204 include enable signals EN1 and EN2 to allow control of the charge pumps 212, 204. When either enable signal EN1, EN2 is high, that particular loop of the dual-loop PLL 100 becomes closed. In the disclosed embodiment, only the first loop 212, 214 or the second loop 204, 206, 200 is active at any one time.

When either the first loop LOOP1 or the second loop LOOP2 is closed (e.g., when the respective enable signal EN1, EN2 is high), the loop filter voltage VTUNE1, VTUNE2 output from respective loop filters 214, 206, is adjusted by the corresponding loop. On the other hand, when the enable signal EN1 or EN2 is low, the respective loop is opened because the respective charge pump 212, 204 no longer injects current into its associated loop filter 214, 206. In this state, either the loop filter 214 or the loop filter 206 will remain unchanged (assuming that the leakage from the same is small and can be neglected within the given data transmission time frame). As a result, the associated varactor 302, 304 will be maintained at the same bias condition.

Figure 4:
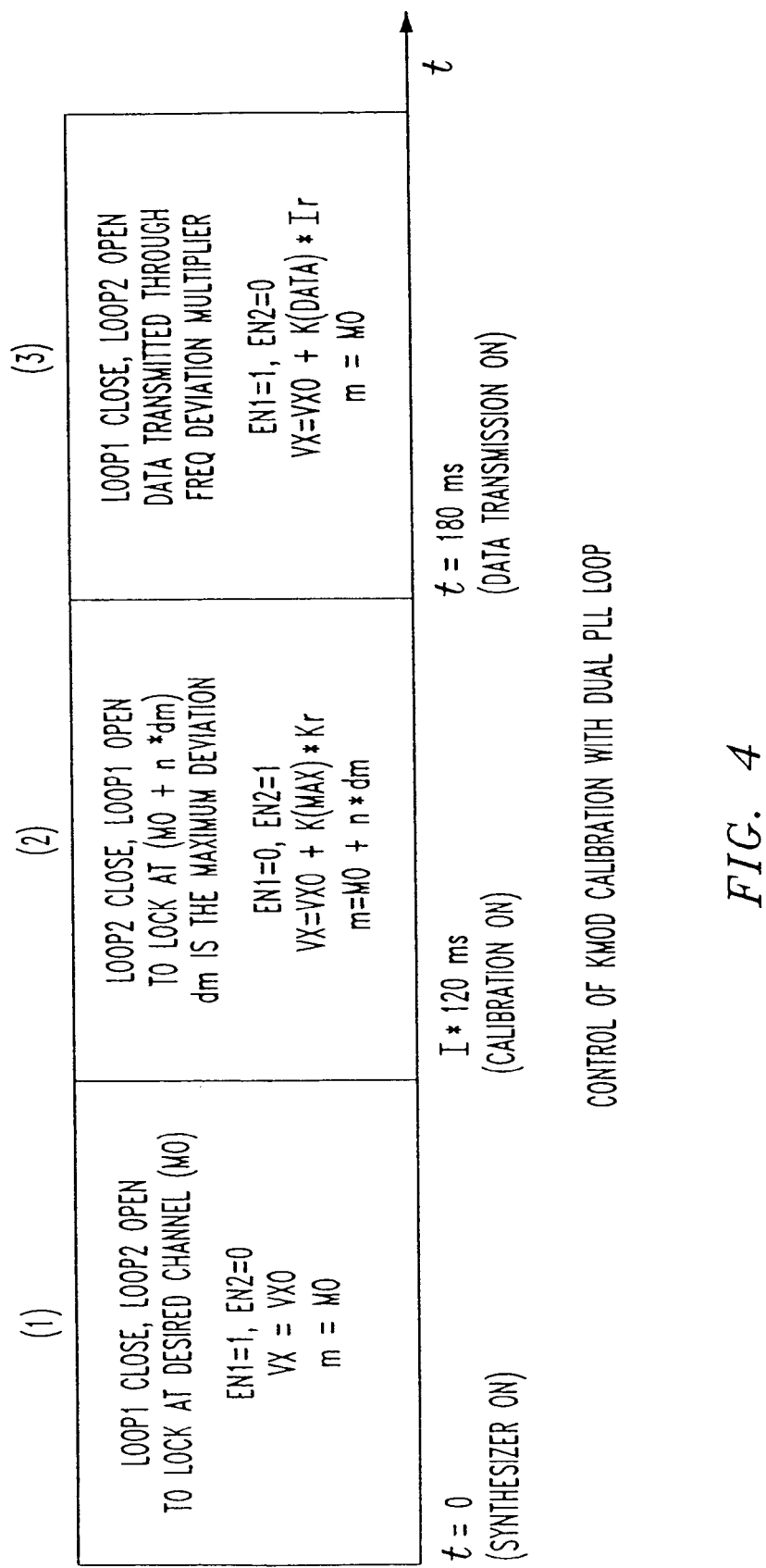
FIG. 4 shows a time line of an exemplary calibration method, in accordance with the principles of the present invention.

FIG. 4 shows a time line of an exemplary calibration method, in accordance with the principles of the present invention. This is referred to herein as "KMOD modulation calibration".

In particular, as shown in FIG. 4, when the RF clock synthesizer is first turned on (t=0), the first loop LOOP1 of the dual-loop PLL 100 is turned on (e.g., EN1=1), and the second loop LOOP2 of the dual-loop PLL 100 is turned off. Thus, the varactor VAR2 becomes biased at the "neutral" position (VX=VX0). By setting the frequency divider 202 to the appropriate division ratio m=m0, after the first loop LOOP1 settling time has passed, the dual-loop PLL 100 will be capable of locking on the desired transmit channel (m0). At this time, $$F_{VCO}=m_0 \cdot F_{ref} \qquad \text{EQ1}$$

Thus, the first loop LOOP1 of the dual-loop PLL 100 locks in on the transmit frequency, i.e. the desired transmit channel (e.g., 2.45 GHz).

Then, after the RF clock synthesizer has been turned on and the first loop LOOP1 has locked in on the desired transmit channel, the active loop of the dual-loop PLL 100 switched by turning the first loop LOOP1 off and the second loop LOOP2 on (e.g., by setting EN1=0 and EN2=1). Turning the first loop LOOP1 off tri-states the first charge pump 212, and causes the first loop filter Lfil1 214 to hold or maintain its current output of VTUNE1. This allows the dual-loop PLL 100 to lock in on the channel created by the second loop LOOP2. Initially (e.g., at t=120 microseconds), the data 102 is not yet injected.

At this point, the division ratio in the frequency divider 202 is set to m=m0+n*dm. dm is related to the maximum deviation by:

$$F_{div}=dm \cdot F_{ref} \qquad \text{EQ2}$$

The data constant K may be set at the maximum value, such as "111111", so that K(max) corresponds to the maximum frequency deviation.

In accordance with the principles of the present invention, the second loop LOOP2 preferably has an adjustment range which is several times that of the KMOD maximum deviation.

After the settling time of the second loop LOOP2, the frequency output from the VCO 216 should be:

$$F_{VCO}=(m_0+n \cdot dm) \cdot F_{ref} \qquad \text{EQ3}$$

where n is an integer (typically '1', but may be larger as explained herein below).

Comparing EQ1 and EQ3, its obvious that the frequency delta is due to VAR2, which is directly related to Ir & VTUNE2 (remember in step(1), VAR2 is biased "neutral"). When n is equal to '1', the frequency delta is the desired maximum frequency deviation (fdiv). When n is not equal to '1', the frequency delta is an integer multiple of $F_{div}$. The n value can be cancelled by dividing the data going to the deviation multiplier 308, or through reduction of the numbers of varactor VAR2 cells in parallel from n to 1.

Lastly, after the second loop LOOP2 becomes settled (e.g., at t=180 microseconds), the active loop of the dual-loop PLL 100 is switched back to operation through the first loop LOOP1 (e.g., by setting EN1='1' and EN2='0'. At this time, the output VTUNE2 of the second loop filter 206, which causes the frequency deviation, is maintained by the second loop filter 206. A reference current Ir is therefore maintained at the input of the deviation multiplier 308.

The data 102 is injected into the dual-loop PLL 100 via the data injector 200. For data transmission, the first loop LOOP1 is once again closed, and the second loop LOOP2 is once again opened. The data 102 is injected through the frequency deviation multiplier 308.

When data transmission starts, the data appears at the deviation multiplier 308, which scales the current and adds it to the bias to the second varactor VAR2. As a result, the second varactor VAR2 will cause a deviation in the locked first loop LOOP1 frequency proportional to the data.

Thus, the maximum frequency deviation becomes calibrated through the use of two locked frequencies, one in each path of the dual-loop PLL 100. Using direct modulation of a VCO 216 as disclosed, a dual-loop PLL 100 is caused to accurately modulate within very tight frequency tolerances (e.g., +/– the maximum deviation dm) in accordance with the data 102.

Figure 5:
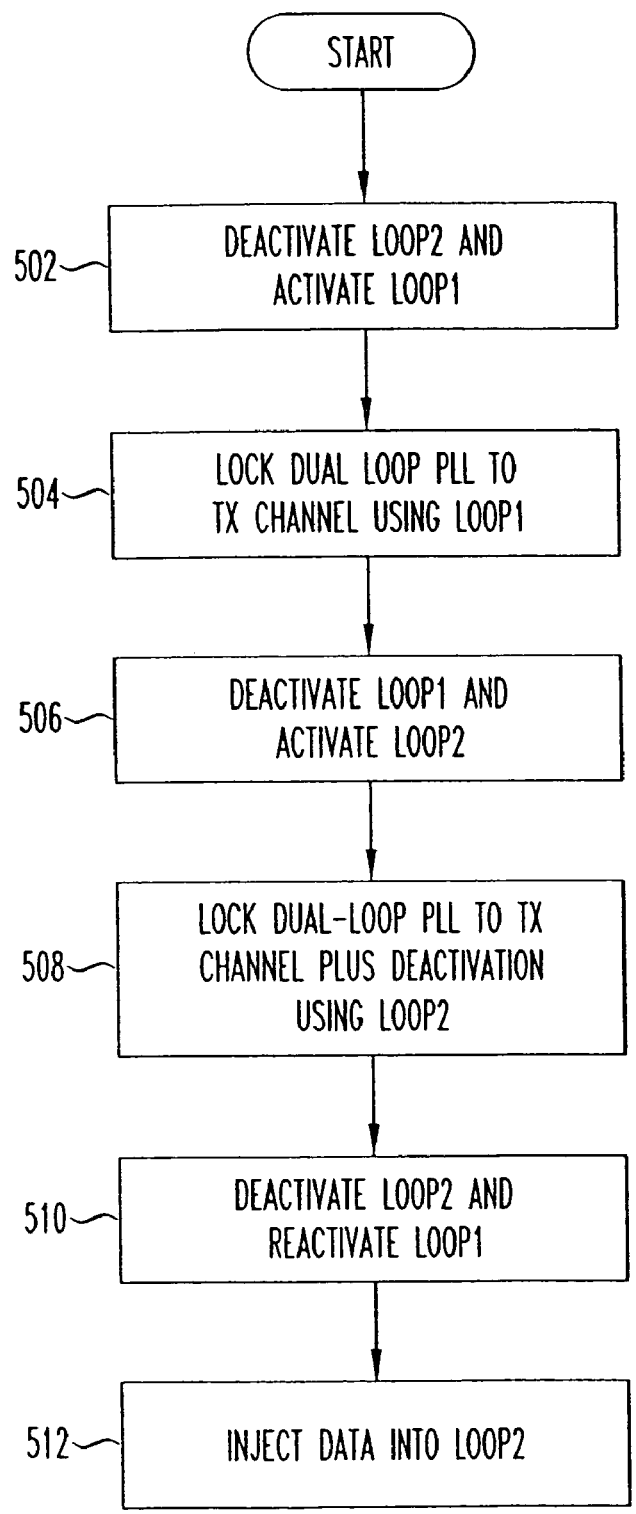
FIG. 5 shows an exemplary calibration method, in accordance with the principles of the present invention.

FIG. 5 shows an exemplary calibration method, in accordance with the principles of the present invention.

In particular, as shown in step 502 of FIG. 5, the second loop LOOP2 of the dual-loop PLL 100 is deactivated, and the first loop LOOP1 is activated.

In step 504, the first loop LOOP1 is used to lock the dual-loop PLL 100 to the desired transmit channel (e.g., 2.45 GHz).

In steps 506 and 508, the second loop LOOP2 of the dual-loop PLL 100 is activated to lock the dual-channel PLL 100 to the desired transmit channel frequency plus a deviation, while the first, main loop LOOP1 is deactivated or tri-stated. In this way, the frequency deviation becomes stored or maintained on the second loop LOOP2.

In steps 510 and 512, at the time of data transmission, the main, first loop LOOP1 is reactivated, and the second loop LOOP2 is tri-stated. During the data transmission, the frequency deviation stored or maintained on the second loop LOOP2 is used to modulate the data directly to the VCO 216.

Figure 6:
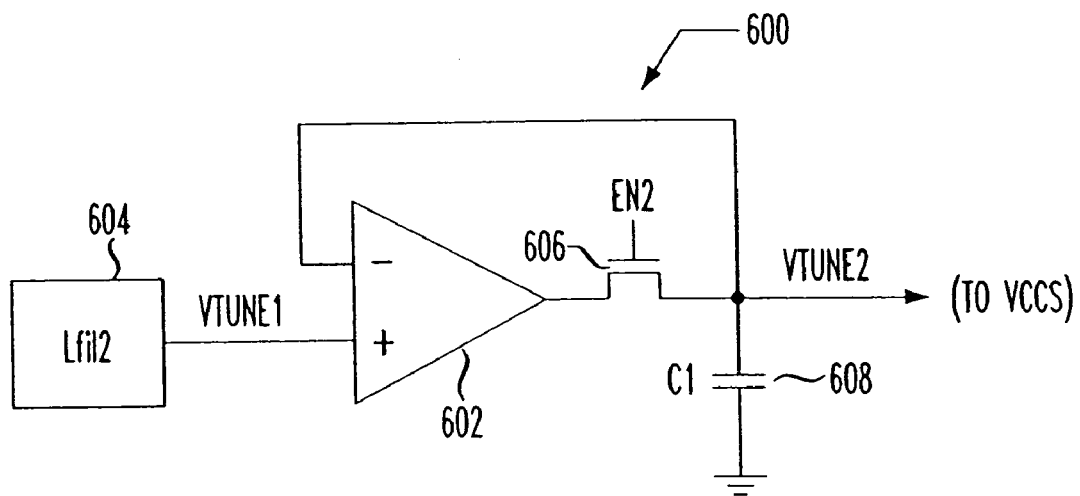
FIG. 6 shows an exemplary technique for minimizing frequency drift caused by leakage of a loop filter, in accordance with the principles of the present invention.
Figure 7:
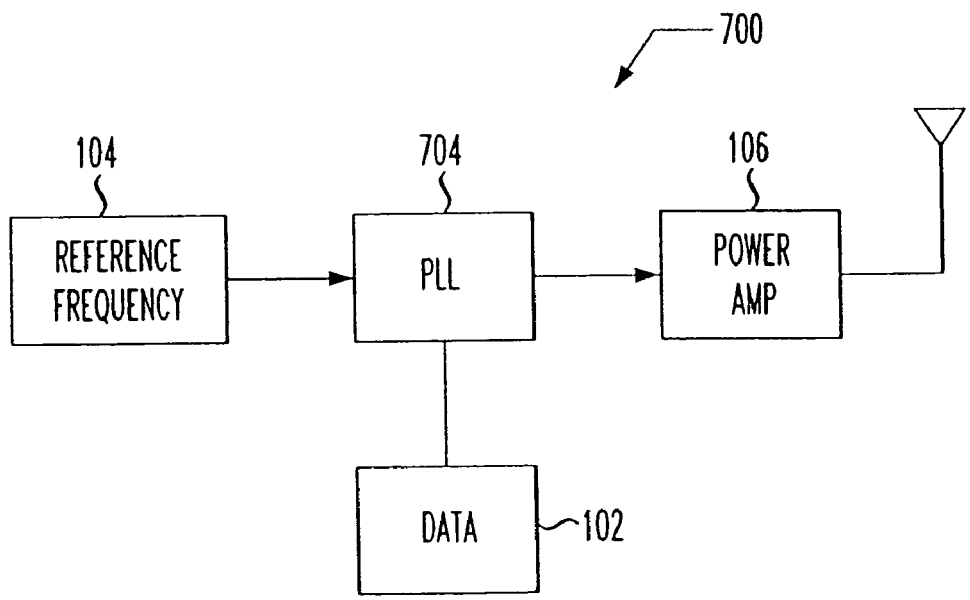
FIG. 7 shows a conventional RF front end including a reference frequency input to a single loop PLL having direct data injection.

Thus, during the entire process, at least one of the two loops of the dual-loop PLL 100 is tri-stated to maintain the bias voltage on its respective loop filter 214, 206. While maintained in a tri-stated or inactive condition, while minimal, there nevertheless is leakage current causing the bias to the respective varactor 302, 304 to slowly degrade. FIG. 6 shows an exemplary technique for minimizing the frequency drift caused by the leakage of a loop filter 214, 206, in accordance with the principles of the present invention.

In particular, as shown in FIG. 6, calibration error comes from frequency drift errors caused when either of the loops LOOP1, LOOP2 are tri-stated, e.g., as shown in steps 502, 506 and 510 of FIG. 5. At this time, the respective loop filter 214, 206 attempt to maintain their output levels VTUNE1, VTUNE2, respectively.

Frequency Drift Caused by Tri-Stating the Loop Filter

Typically, for relatively short time frames, frequency drift is not overly significant. With respect to this, the first loop LOOP1 need only maintain the level of VTUNE1 for the length of the calibration process, which in the given embodiment is less than about 120 microseconds. If the capacitor values of the loop filter 214 are sufficiently large, frequency drift caused due to leakage current can essentially be ignored.

More significantly, the second loop LOOP2 must maintain the level VTUNE2 from the second loop filter 206 for the entire length of time of the data transmission. In a typical application such as one conforming to the BLUETOOTH™ piconet standard, the data transmission time will be less than a few milliseconds for frequency-hopping standards.

The capacitor in the second loop filter 206 is much smaller than the capacitor in the first loop filter 214, and thus it is likely that the maintained level VTUNE2 will degrade faster due to leakage current. However, in the disclosed embodiment, the second varactor VAR2 is smaller, and $dF_{vco}/dV_{tune}$ is much smaller, thus allowing the second loop LOOP2 to tolerate a greater voltage drop due to leakage.

FIG. 6 shows an exemplary way of improving the frequency drift performance of the dual-loop PLL design disclosed herein by allowing the second loop LOOP2 to sustain a longer open-loop time.

In particular, as shown in FIG. 6, the output VTUNE2 of the second loop filter 206 is buffered to a bigger capacitor, reducing the leakage rate. However, if the output VTUNE2 of the second loop filter 206 is buffered, care should be taken to ensure that the buffering does not significantly degrade the phase margin of the dual-loop PLL 100.

Frequency Error Caused by Open Loop of Dual-Loop PLL

At steps 506–512 shown in FIG. 5, the first and second loops LOOP1, LOOP2 are opened respectively after the loop is deemed locked. However, if the VCO 216 is not yet locked to the desired target frequency, and there is a error, then this error would trickle into the maximum deviation.

One technique for reducing this error is to design a frequency delta n (integer) times a target for the frequency deviation. This reduces the error percentage a given number n times.

For example, if the error due to inaccurate phase locking is 20 KHz, a target deviation is 150 KHz; with n=1, i.e., the frequency delta is 150 KHz, the error would be (20/150)* 100%. However, if the frequency delta is then increased to 1.5 MHz by setting n=10, then the error would be proportionally reduced: (20/1500)*100%.

The use of n>1 requires a scaling down of the deviation by n through a smaller varactor for sending data, or multiplication of (1/n) to the transmitted data.

The present invention has particular use in direct modulation transmitters in general, or in FSK transceiver devices or even piconet transceiver devices more particularly, e.g., BLUETOOTH transceiver devices such as the AGERE SYSTEMS INC. Model No. W4120/W4121.

While the present invention is shown and described with reference to piconet devices in general, and to BLUETOOTH devices in particular, it has equal applicability to other types of radio frequency (RF) transceivers, particularly those employing direct modulation in general or FSK modulation in particular.

While the invention has been described with reference to the exemplary preferred embodiments thereof, those skilled in the art will be able to make various modifications to the described embodiments of the invention without departing from the true spirit and scope of the invention.

What is claimed is:

1. A phase locked loop in an RF transmission system, comprising:
   a first forward path to lock on a transmission channel frequency of said RF transmission system; and
   a second forward path to lock on an error offset associated with modulation gain through said phase locked loop; and
   a common feedback path used by both said first forward path and said second forward path.

2. The phase locked loop in an RF transmission system according to claim 1, wherein said common feedback path comprises:
   a frequency divider.

3. The phase locked loop in an RF transmission system according to claim 1, wherein:
   said first forward path and said second forward path utilize a common phase comparator.

4. The phase locked loop in an RF transmission system according to claim 1, wherein:
   said first forward path and said second forward path utilize a common voltage controlled oscillator.

5. The phase locked loop in an RF transmission system according to claim 1, wherein said first forward path comprises:
   a charge pump; and
   a loop filter.

6. The phase locked loop in an RF transmission system according to claim 5, wherein said first forward path further comprises:
   a varactor receiving an output from said loop filter.

7. The phase locked loop in an RF transmission system according to claim 1, wherein:
   said RF transmission system is part of a piconet device.

8. The phase locked loop in an RF transmission system according to claim 7, wherein:
   said piconet device conforms to a BLUETOOTH standard.

9. The phase locked loop in an RF transmission system according to claim 1, wherein said second forward path comprises:
   a charge pump;
   a loop filter; and
   a data injector.

10. The phase locked loop in an RF transmission system according to claim 9, wherein said second forward path further comprises:
    a varactor receiving an output from said loop filter.

11. The phase locked loop in an RF transmission system according to claim 9, wherein said data injector comprises:
    a voltage controlled current source in series with a deviation multiplier.

12. A method of transmitting a data signal accurately in a transmission channel, comprising:
    activating a first loop of a phase locked loop to lock a first main loop of said phase locked loop to a transmit channel frequency;
    activating a second loop of said phase locked loop to lock the phase locked loop to said transmit channel frequency plus a deviation; and
    reactivating said first loop of said phase locked loop and modulating data directly to a voltage controlled oscillator of said phase locked loop;
    whereby modulation gain is calibrated.

13. The method of transmitting a data signal accurately in a transmission channel according to claim 12, wherein:
   said first main loop is deactivated when said second loop is active.

14. The method of transmitting a data signal accurately in a transmission channel according to claim 13, wherein:
   said first main loop is deactivated by tri-stating a charge pump therein.

15. The method of transmitting a data signal accurately in a transmission channel according to claim 12, wherein:
   said second loop is deactivated when said first main loop is active.

16. The method of transmitting a data signal accurately in a transmission channel according to claim 12, wherein:
   during an entire data transmission cycle, one of said first loop and said second loop are tri-stated to maintain a bias voltage on a respective loop filter therein.

17. The method of transmitting a data signal accurately in a transmission channel according to claim 16, further comprising:
   buffering an output of a loop filter in said second loop.

18. Apparatus for transmitting a data signal accurately in a transmission channel, comprising:
   means for activating a first loop of a phase locked loop to lock a first main loop of said phase locked loop to a transmit channel frequency;
   means for activating a second loop of said phase locked loop to lock the phase locked loop to said transmit channel frequency plus a deviation, while deactivating said first loop; and
   means for reactivating said first loop of said phase locked loop and modulating data directly to a voltage controlled oscillator of said phase locked loop;
   whereby modulation gain is calibrated.

19. The apparatus for transmitting a data signal accurately in a transmission channel according to claim 18, further comprising:
   means for buffering an output of a loop filter in said second loop.

* * * * *